United States Patent [19]
Lester et al.

[11] Patent Number: 5,777,433
[45] Date of Patent: Jul. 7, 1998

[54] HIGH REFRACTIVE INDEX PACKAGE MATERIAL AND A LIGHT EMITTING DEVICE ENCAPSULATED WITH SUCH MATERIAL

[75] Inventors: Steven D. Lester, Palo Alto; Jeffrey N. Miller, Los Altos Hills; Daniel B. Roitman, Menlo Park, all of Calif.

[73] Assignee: Hewlett-Packard Company, Palo Alto, Calif.

[21] Appl. No.: 678,276

[22] Filed: Jul. 11, 1996

[51] Int. Cl.$^6$ ............................................. H01J 1/62

[52] U.S. Cl. .................... 313/512; 313/500; 313/312; 362/800

[58] Field of Search ........................ 313/512, 500, 313/312; 362/800

[56] References Cited

U.S. PATENT DOCUMENTS

| | | | |
|---|---|---|---|
| 3,739,241 | 6/1973 | Thillays | 313/512 X |
| 3,760,237 | 9/1973 | Jaffe | 313/512 X |
| 5,019,746 | 5/1991 | Merg | 313/512 |
| 5,093,768 | 3/1992 | Ohe | 313/512 X |
| 5,289,082 | 2/1994 | Komoto | 313/512 X |
| 5,460,701 | 10/1995 | Parker et al. | 204/164 |
| 5,514,349 | 5/1996 | Parker et al. | 422/186.21 |

OTHER PUBLICATIONS

Kurata et al., "An Experienced Study on Improvement of Performance for Hemispherically Shaped High–Power IRED's with Ga1–xAlxAs Grown Junctions", 1981, vol. ED–28(4), p. 374, IEEE Transactions on Electron Devices.

Carr et al., "One-Watt GaAs p–n Junction Infrared Source", 1963, pp. 173–175, vol. 3(10), Applied Physics Letters.

*Primary Examiner*—Ashok Patel
*Attorney, Agent, or Firm*—Thomas X. Li

[57] ABSTRACT

A high refractive index package material is described that encapsulates a semiconductor light emitting chip. The high refractive index package material is transparent to the light emitted from the chip and includes a host material and a plurality of nanoparticles held in the host material. The host material has a refractive index lower than that of the chip and is transparent to the light emitted from the chip. The nanoparticles are (1) formed from a material having a refractive index higher than that of the host material, (2) substantially smaller in size than the wavelength of the light emitted from the chip, (3) included in the host material at such a density that the effective refractive index of the high refractive index package material is higher than that of the host material without decreasing the transparency of the high refractive index package material.

8 Claims, 5 Drawing Sheets

HIGH REFRACTIVE INDEX PACKAGE MATERIAL AND A LIGHT EMITTING DEVICE ENCAPSULATED WITH SUCH MATERIAL

BACKGROUND OF THE INVENTION

1. Field of the Invention

The present invention pertains to semiconductor light emitting devices. More particularly, this invention relates to a high refractive index material for encapsulating a light emitting device (e.g., light emitting diode) such that the efficiency of the light emitting device is improved.

2. Description of the Related Art

FIG. 1 shows one type of prior art semiconductor light emitting diode (LED) 10. As can be seen from FIG. 1, the LED 10 typically includes a semiconductor LED chip 12 encapsulated by a package 11. A pair of electrical contacts 15 and 16 are connected to the LED chip 12. FIG. 2 shows a typical structure of the LED chip 12.

In FIG. 2, the LED chip 12 includes a metal layer 25 that contacts the electrical contact 15 of FIG. 1. An n-type layer 23 is formed on the metal layer 25. A p-type layer 22 is then formed on the n-type layer 23. The n-type layer 23 can be formed by many different LED materials, such as GaAs, GaP, $GaAs_{1-x}P_x$, (Gallium arsenide phosphide), $Ga_xkAl_{1-x}$ As (Gallium aluminum arsenide), and InGaAlN. The p-type layer 22 can be formed through zinc-diffusion or Magnesium-doping. Another metal layer 20 is formed on the p-type layer 22. The metal layer 20 is then connected to the electrical contact 16 via wire 13 (FIG. 1).

Referring to FIGS. 1 and 2, when an electrical voltage is applied to the electrical contacts 15–16, the p-n junction 13 of the LED chip 12 generates light, some of which is emitted into the package 11 that encapsulates the LED chip 12 via the uncovered portion of the p-type layer 22 (FIG. 2). The package 11 is transparent to the light emitted from the LED chip 12. This allows the light emitted from the LED chip 12 to emerge out of the package 11. The package 11 is typically a thermoset material, such as epoxy or thermo-plastic material.

Disadvantages are, however, associated with such prior art LED. One disadvantage is that known materials for the package used to encapsulate the LED chip typically have a lower refractive index than that of the LED chip, thus reducing the amount of light emitted out of the LED. The relatively low refractive index of the insulating package imposes a relatively high critical angle loss to the light emitted from the LED chip. The critical angle loss is due to the total internal reflection of light incident to the LED chip surface at angles greater than the critical angle $\theta_c$. The critical angle $\theta_c$ refers to the light incident angle to the surface of the LED chip at which the refraction angle of the light at the package surface is equal to 90°. When the critical angle $\theta_c$ is greater, more light can escape the LED chip into the package. The critical angle $\theta_c$ can be calculated using the equation $\theta_c = \sin^{-1}(n_2/n_1)$, wherein $n_1$ is the refractive index of the LED chip and $n_2$ is the refractive index of the package. Encapsulating an LED chip in a low refractive index medium decreases the critical angle $\theta_c$, thus reducing the light that can escape from the LED chip.

In addition, the relatively low refractive index of the insulating package also causes fresnel loss, though the critical angle loss has a much greater effect than the fresnel loss. As is known, the refractive index of a LED chip is typically between 2.4 and 3.6 while the refractive index of an epoxy or plastic package is typically between 1.4 and 1.6. When the light passes from the LED chip to the epoxy or plastic package, a portion of the light is reflected back at the interface of the two media because of the different refractive indices. This loss of light is referred to as the fresnel loss. For a LED chip having a refractive index of 3.5 and an epoxy package having a refractive index of 1.5, at best approximately 84% of the light reaching the chip surface and being normal to the surface of the chip is transmitted across the chip/epoxy interface.

Prior attempts have been made to use chalcogenide glasses having higher refractive indices than those of the epoxy and plastic to encapsulate a LED chip. However, chalcogenide glasses are much more difficult to process during mass production of LEDs than epoxy or plastic. In addition, extra and/or different equipment is required for processing the chalcogenide glasses. Moreover, these materials are typically not sufficiently transparent to the light emitted from the LED chip.

Another prior attempt to increase the efficiency of the LED chip is to make the LED chip in a hemispherical shape. This causes most of the light emitted from the p-n junction of the LED chip to reach the chip surface at an angle less than the critical angle, thus significantly reducing internal reflection at the chip/air interface. However, this approach is not economical and practical because the hemispherically shaped chip is typically large and difficult to fabricate.

SUMMARY OF THE INVENTION

The present invention improves the efficiency of a semiconductor light emitting device by reducing the fresnel loss and increasing the critical angle of the device.

The present invention increases the effective refractive index of a package that encapsulates a semiconductor light emitting device such that the efficiency of the light emitting device is improved.

The present invention also provides a package material that (1) has a higher refractive index than that of any conventional package material, (2) is easy to process for encapsulating a semiconductor light emitting device during mass production, and (3) is substantially transparent to the light emitted from the light emitting device.

A high refractive index package material is described that encapsulates a semiconductor light emitting chip. The high refractive index package material must be transparent to the light emitted from the chip and includes a host material and a plurality of nanoparticles held in the host material. The nanoparticles refer to materials or particles whose dimensions are in the range of 10 nm to 1000 nm. The host material has a refractive index lower than that of the chip and is transparent to the light emitted from the chip. The nanoparticles are (1) formed from a material having a refractive index higher than that of the host material, (2) substantially smaller in size than the wavelength of the light emitted from the chip, (3) included in the host material at such a density that the effective refractive index of the high refractive index package material is higher than that of the host material without decreasing the transparency of the high refractive index package material.

In addition, a light emitting device is also described that has (1) an LED chip that emits light and (2) a high refractive index package material that encapsulates the LED chip. The high refractive index package material must be transparent to the light emitted from the LED chip and includes a host material that has a refractive index lower than that of the LED chip and is transparent to the light emitted from the LED chip. The high refractive index package material also includes a plurality of nanoparticles that are (1) formed from a material having a refractive index higher than that of the host material, (2) substantially smaller in size than the wavelength of the light emitted from the LED chip, and (3) included in the host material at such a density that the effective refractive index of the high refractive index package material is higher than that of the host material without decreasing the transparency of the high refractive index package material.

Other features and advantages of the present invention will become apparent from the following detailed description, taken in conjunction with the accompanying drawings, illustrating by way of example the principles of the invention.

DETAILED DESCRIPTION OF THE INVENTION

Figure 1:
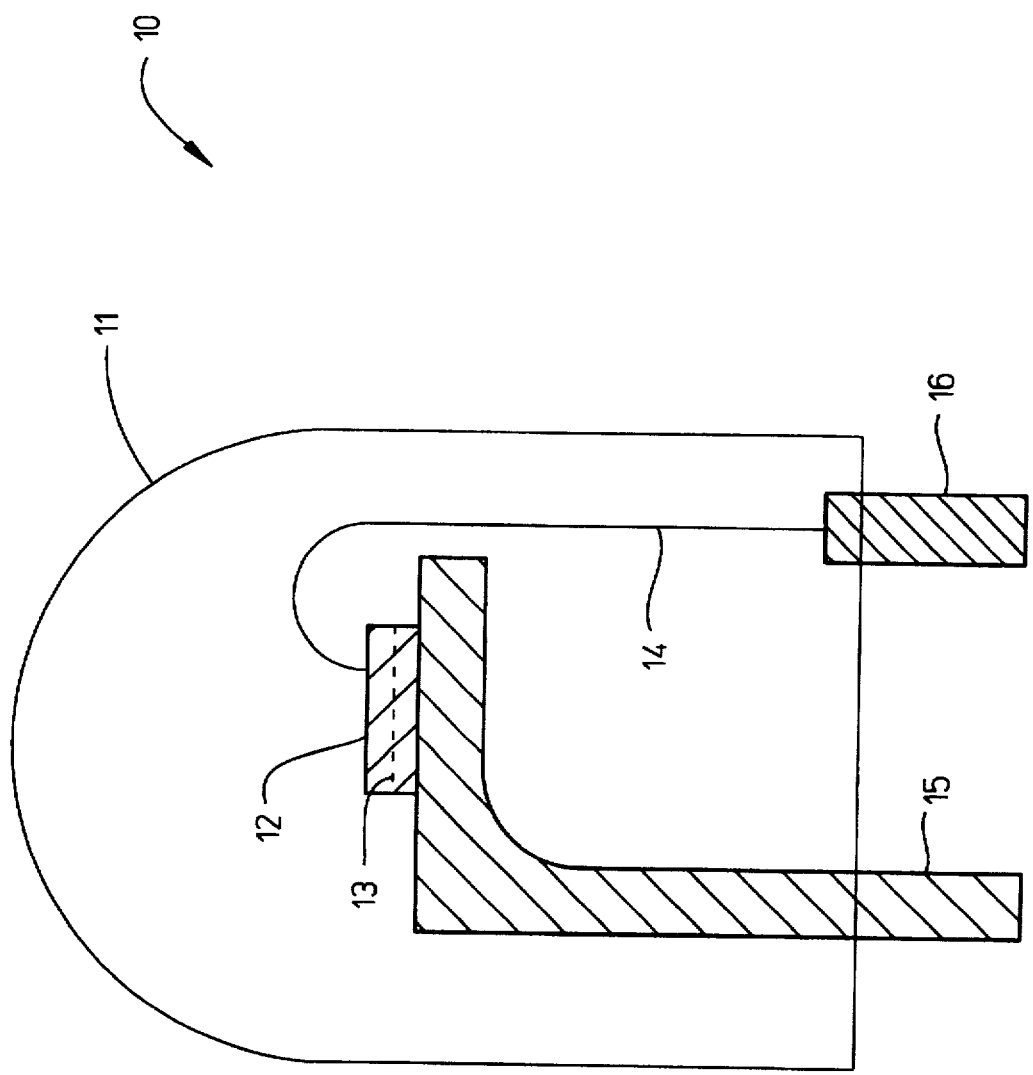
FIG. 1 shows a prior art LED having an LED chip and a package.
Figure 2:
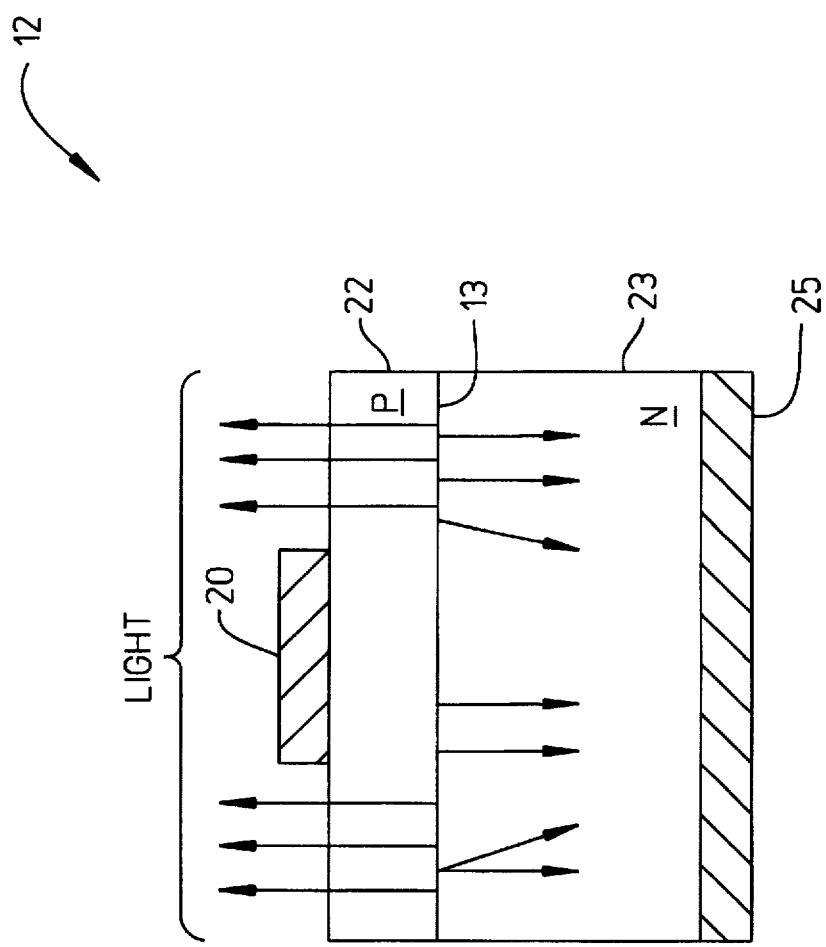
FIG. 2 shows the structure of the LED chip of FIG. 1.
Figure 3:
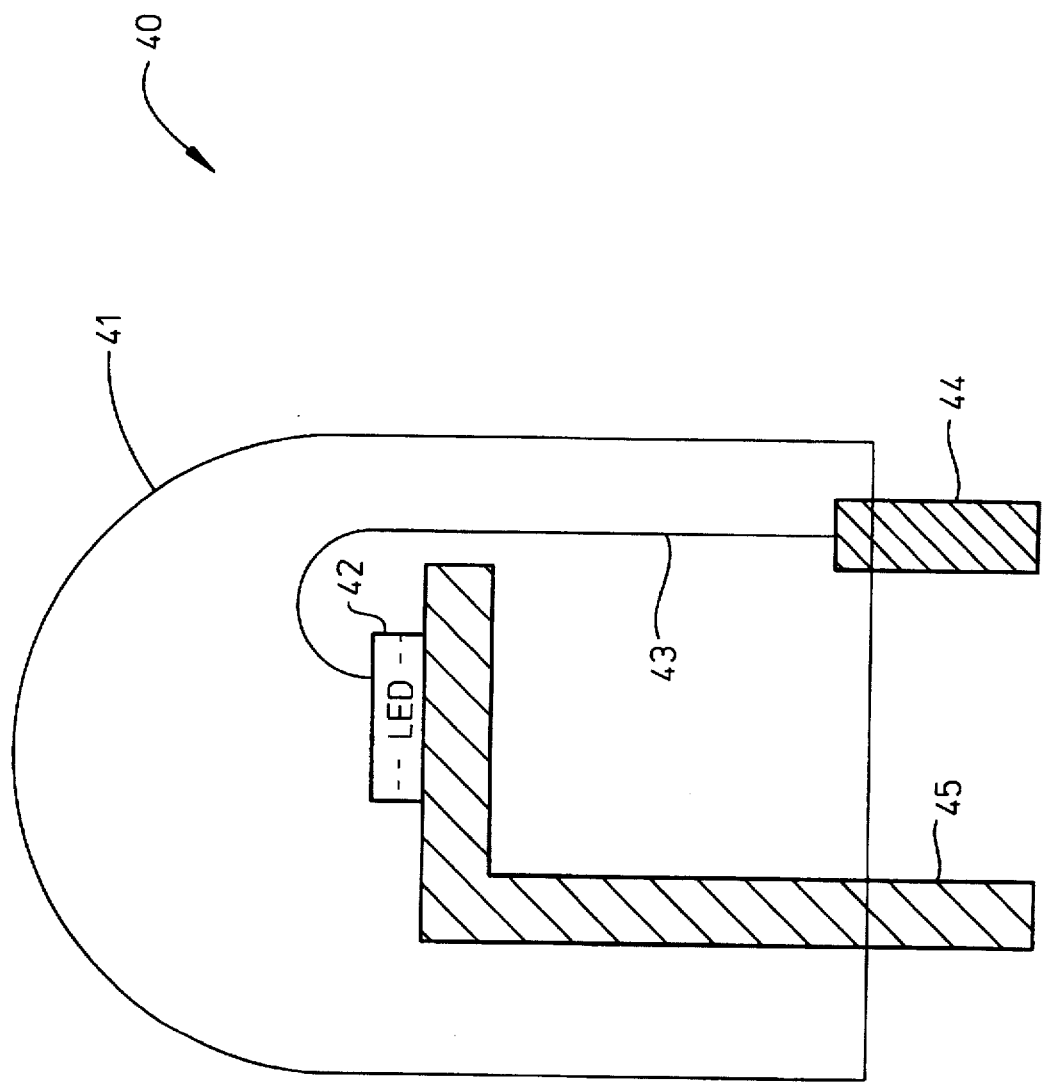
FIG. 3 shows an LED having an LED chip packaged by a high refractive index material in accordance with one embodiment of the present invention.

FIG. 3 illustrates a light emitting device 40 that includes an light emitting diode (LED) chip 42 packaged in a high refractive index package material 41. The LED chip 42 also has a high refractive index. The high refractive index package material 41 is formed in accordance with one embodiment of the present invention such that its refractive index can be approximately as high as that of the LED chip 42 and is higher than that of conventional package materials for LEDs (such as epoxy, plastics, and other types of conventional organic packaging materials). In addition, the package material 41 in accordance with one embodiment of the present invention is substantially transparent to the light emitted from the LED chip 42. Moreover, the package material 41 is also easy to process for encapsulating the LED chip 42 during mass production. The package material 41 will be described in more detail below, also in conjunction with FIGS. 4 and 5.

Referring again to FIG. 3, the LED chip 42 can be any known LED chip and is made using any known LED fabrication process. Alternatively, the LED chip 42 can be any other type of light emitting chip. The light emitting device 40 also includes a pair of electrical contacts 44 and 45. A wire 43 connects the electrical contact 44 to one side of the LED chip 42. The electrical contact 45 is connected to the other side of the LED chip 42. The package material 41 encapsulates the entire LED chip 42, the wire 43, and most of the electrical contacts 44 and 45, thus forming the light emitting device 40. The light emitting device 40 is generally in the shape of lens. The light emitting device 40 can also be dome-shaped, half dome-shaped, cubical-shaped. In addition, the light emitting device 40 can be configured in any other shapes. An electrical voltage can be applied to the LED chip 42 via the unencapsulated portion of the electrical contacts 44 and 45.

In one embodiment, the refractive index of the LED chip 42 ranges from 3.3 to 3.6. Alternatively, the refractive index of the LED chip 42 can be greater than 3.6 or less than 3.3.

The light emitted from the LED chip 42 can be visible light or invisible light. In one embodiment, when the LED chip 42 is an invisible light LED chip, the LED chip 42 generates infrared light. Thus, the LED chip 42 can be an infrared LED chip, an LED chip that emits red light, an LED that emits green light, or an LED chip that emits violet light, etc. As is known, the kind of light emitted from the LED chip 42 depends on the semiconductor material used to form the LED chip 42.

As is known, the wavelength of the infrared light ranges from 700 nm to greater than 1600 nm and the wavelength of the visible light ranges from 400 nm (i.e., violet color) to 700 nm (i.e., red color). Therefore, when the LED chip 42 is an infrared LED chip that emits an infrared light of a predetermined wavelength, the package material 41 needs to be transparent to the infrared light of that wavelength. When the LED chip 42 is an LED chip that emits red light, the package material 41 needs to be transparent to the red light. When the LED chip 42 emits violet light, the package material 41 needs to be transparent to the violet light.

As described above and in accordance with one embodiment of the present invention, the package material 41 has a relatively high refractive index while still being completely transparent or substantially transparent to the light emitted from the LED chip 42. In addition, the package material 41 is easy to process when used for encapsulating the LED chip 42. These characteristics of the package material 41 are achieved by making the package material 41 in the following manner. First, nanoparticles of a high refractive index material (e.g., $TiO_2$) are formed. The nanoparticles of the high refractive index material are then mixed into a relatively low refractive index host material (e.g., epoxy). The host material is transparent to the light emitted from the LED chip 42 and is easy to process. The nanoparticles are substantially smaller in size than the wavelength of the light emitted from the LED chip 42 such that the package material 41 can be as transparent to the light emitted from the LED chip 42 as the host material. The nanoparticles are loaded into the host material at such a density that the effective refractive index of the package material 41 is higher than that of the low refractive index host material without decreasing the transparency of the package material 41. In addition, using a low refractive index material that is easy to process allows the package material 41 to be easy to process. The composition of the package material is shown in FIG. 4, which will be described in more detail below.

Figure 4:
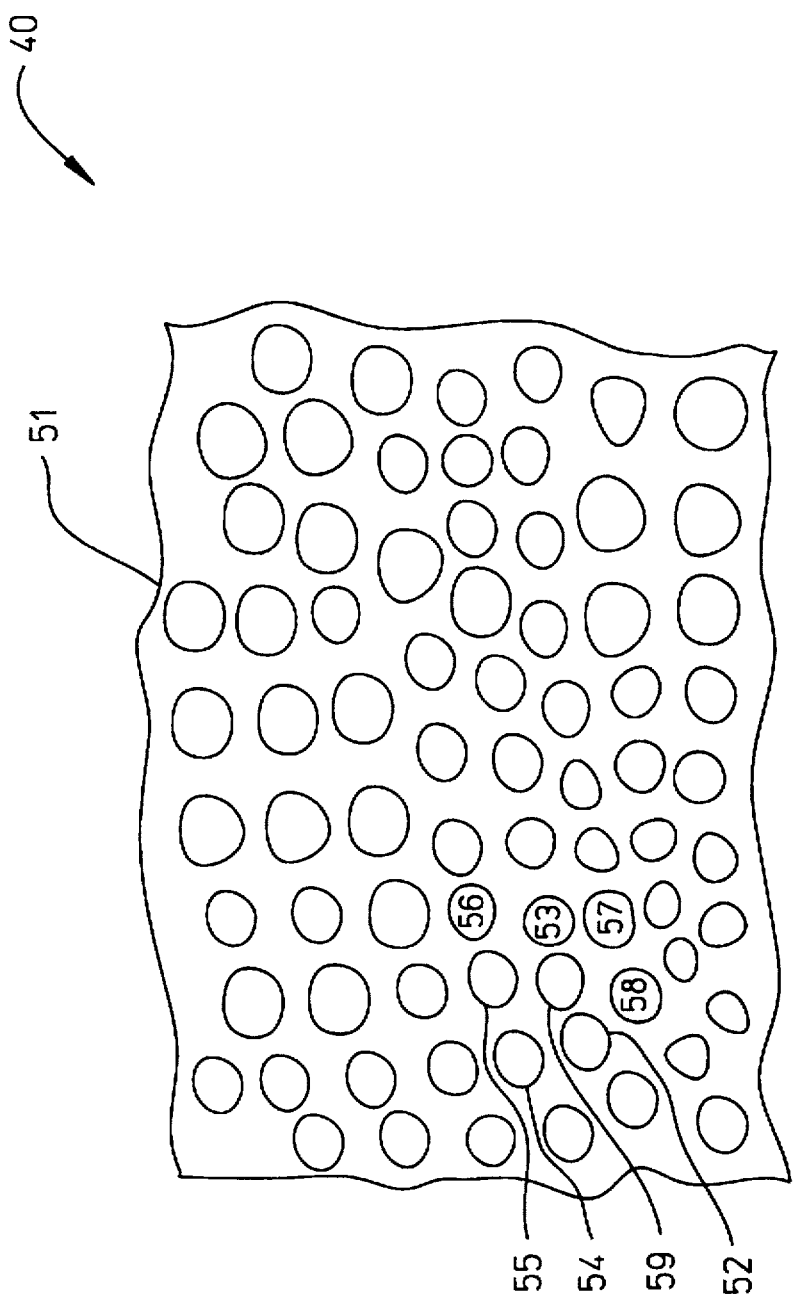
FIG. 4 illustrates the foundation of the high refractive index material of FIG. 3.

As can be seen from FIG. 4, the package material 41 includes the host material 51 filled with the nanoparticles (e.g., nanoparticles 52 through 59). FIG. 4 only schematically illustrates the nanoparticles mixed in the host material 51. In addition, not all the nanoparticles shown in FIG. 4 are labeled with a reference number.

As can be seen from FIG. 4, the nanoparticles are not in physical contact with each other in the host material 51. Instead, the nanoparticles in the host material 51 are such that they are separated by the host material 51. For example, the nanoparticle 52 is separated from adjacent nanoparticles 53 through 59 and does not physically contact any of the adjacent nanoparticles 53–59.

The shape of the nanoparticles is not important. In one embodiment, the nanoparticles are substantially spherical. Alternatively, the shape of the nanoparticles can be non-spherical. Moreover, the nanoparticles do not need to have the same shape.

To allow the package material 41 to assume the refractive index of the nanoparticle material, the density of the nanoparticles in the host material 51 needs to be made as high as possible without the nanoparticles aggregating or agglomerating (i.e., without causing any nanoparticle to physically contact any of its adjacent nanoparticles) in the host material 51 during formation of the package material 41. When any of the nanoparticles is in physical contact with another nanoparticle, the two nanoparticles essentially become one nanoparticle having a much larger size than any of the two nanoparticles. This typically causes the transparency of the package material 41 to decrease or degrade.

Figure 5:
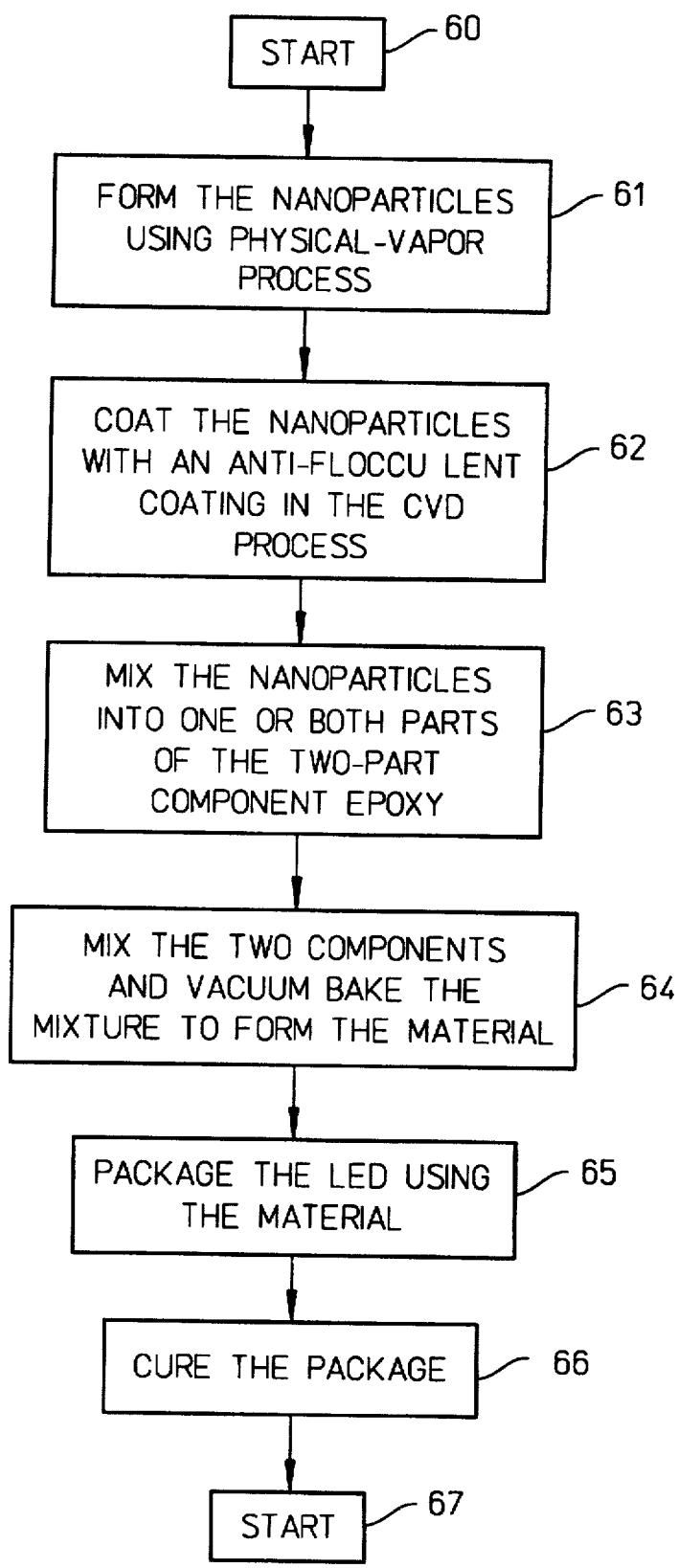
FIG. 5 is a flow chart diagram showing the process of fabricating the high refractive index material.

To prevent the nanoparticles from agglomerating during formation of the package material 4 1, the nanoparticles are coated with an anti-flocculant coating (not shown in FIG. 5) before being mixed into the host material 5 1. This prevents the nanoparticles from aggregating or flocking together. In one embodiment, the anti-flocculant coating is a surfactant organic coating. Alternatively the anti-flocculant coating can be any other known organic coating with anti-flocculant property. The process of manufacturing the package material 41 is shown in FIG. 5, which will be described in more detail below.

Referring again to FIGS. 3 and 4, as described above, the size of the nanoparticles in the host material 51 needs to be substantially smaller than the wavelength of the light emitted from the LED chip 42 (FIG. 3). This ensures the package material 41 to be transparent to the light emitted from the LED chip 42. For example, if the LED chip 42 emits the red light, then the size of each of the nanoparticles needs to be substantially smaller than 700 nm. When the LED chip 42 emits the violet light, then the size of each of the nanoparticles needs to be substantially smaller than 400 nm. If the LED chip 42 emits an infrared light having a wavelength of 800 nm, then the size of each of the nanoparticles needs to be substantially smaller than 800 nm.

In one embodiment, the maximum size of each of the nanoparticles is 1/5 of the wavelength of the light emitted from the LED chip 42. In another embodiment, the size of each of the nanoparticles ranges between 1/10 and 1/20 of the wavelength of the light emitted from the LED chip 42. In one embodiment, the nanoparticles are uniform in size. In another embodiment, the nanoparticles are not uniform in size. This means that some nanoparticles are larger than other nanoparticles.

The nanoparticles can be produced using a variety of transparent metal oxides or group II-VI materials that are relatively free from scattering. In one embodiment, the nanoparticle material is Titanium dioxide ($TiO_2$). In other embodiments, other types of transparent metal oxides or combinations of metal oxides can be used. For example, Magnesium Oxide (MgO), Yttria (YtO), Zirconia ($ZrO_2$), $CeO_x$, Alumina ($Al_2O_3$), Lead Oxide ($PbO_x$), and a composite material of Yttria and Zirconia can be used to produce the nanoparticles. In yet other embodiments, the nanoparticles are made from one of the group II-VI materials including Zinc Selenide (ZnSe), Zinc Sulphide (ZnS), and alloys made from Zn, Se, S, and Te (Tellurium). Alternatively, Gallium Nitride (GaN), Silicon Nitride (SiN), or Aluminum Nitride (AlN) can be also used to make the nanoparticles.

In one embodiment, the refractive index of the nanoparticle material ranges from 2.0 to 3.5. Alternatively, the refractive index of the nanoparticle material can be greater than 3.5 or less than 2.0.

The host material 51 can be selected from a number of different low refractive index and easy-to-process materials. For example, the host material 51 can be epoxy, glass, plastics, or thermo-plastics. Alternatively, other types of low refractive index organic materials can also be used as the host material 51. In one embodiment, the refractive index of the host material 51 ranges from 1.4 to 1.6. Alternatively, the refractive index of the host material 51 can be greater than 1.6 or less than 1.4.

Thus, the refractive index of the package material 41 is approximately between 1.6 and 3.0.

In one embodiment, the package material 41 is a composite material. In this case, the nanoparticles are merely mixed and held in the host material 51 to form the package material 41. Alternatively, the nanoparticles and the host material 51 of the package material 41 form a compound. In this case, the nanoparticles are bonded to the host material 51 via chemical reaction.

FIG. 5 shows the process of making the package material 41 using $TiO_2$ nanoparticles and epoxy as the host material, which illustrates one example of the present invention. The process of forming the high refractive material 41 starts at step 60. At step 61, the $TiO_2$ nanoparticles (such as those shown in FIG. 4) are formed using a physical vapor process. The maximum size of the $TiO_2$ nanoparticles is controlled by the physical vapor process to be at most 1/5 of the wavelength of the light emitted from the LED chip 42.

In one embodiment, the physical vapor process is described in U.S. Pat. No. 5,514,349, by John C. Parker et al., issued May 7, 1996, entitled A SYSTEM FOR MAKING NANOSTRUCTURED MATERIALS, assigned to Nanophase Technologies Corporation, of Darien, Ill., and U.S. Pat. No. 5,460,701, by John C. Parker et al., issued Oct. 24, 1995, entitled A METHOD FOR MAKING NANO-STRUCTURED MATERIALS, and also assigned to Nanophase Technologies Corporation, of Darien, Illinois. Alternatively, the physical vapor process can be any known process for making nanoparticles. For example, the nanoparticles can be made in solutions using known methods.

At step 62, the $TiO_2$ nanoparticles are coated with the anti-flocculant coating. This is also done during the physical-vapor process and as part of the physical-vapor process. The anti-flocculant coating protects the $TiO_2$ nanoparticles and prevents the nanoparticles to flock or aggregate together. At step 63, the $TiO_2$ nanoparticles are mixed into one or both components of the epoxy. The epoxy can be any known twocomponent epoxy. The mixing of the nanoparticles into one or both components of the epoxy is done using a high-sheer stress mixing equipment to ensure that the nanoparticles are thoroughly mixed and are not aggregated in the epoxy.

At step 64, the two parts of the epoxy (with one part or both parts already mixed with the nanoparticles) are mixed together and vacuumbaked at approximately 100° C. to extract air from the mixture. This forms the package material 41. At this time, the package material 41 is ready for use to mold or encapsulate the LED chip 42 (FIG. 3).

Steps 65 and 66 are related to packaging the LED chip 42 using the package material 41 made at the end of the step 64. At step 65, the package material 41 is put into a mold together with the LED chip 42 to obtain the light emitting device 40 (FIG. 3). At step 66, the molded light emitting device 40 is cured for one to six hours at a temperature ranging approximately from 100° C. to 300° C., depending on the formulation of the epoxy. The process can then end at step 67.

In the foregoing specification, the invention has been described with reference to specific embodiments thereof. It will, however, be evident to those skilled in the art that various modifications and changes may be made thereto without departing from the broader spirit and scope of the invention. The specification and drawings are, accordingly, to be regarded in an illustrative rather than a restrictive sense.

What is claimed is:

1. A light emitting device, comprising:

(A) a light emitting diode (LED) chip that emits light;

(B) a high refractive index package material that encapsulates the LED chip and is transparent to the light, the package material including
- (a) a host material having a refractive index lower than that of the LED chip and being transparent to the light;
- (b) nanoparticles (1) of a material having a refractive index higher than that of the host material, (2) being substantially smaller in size than the wavelength of the light, and (3) being included in the host material at such a density that the refractive index of the package material is higher than that of the host material without decreasing transparency of the package material.

2. The light emitting device of claim 1, wherein the size of each of the nanoparticles is between 1/5 and 1/20 of the wavelength of the light emitted from the LED chip.

3. The light emitting device of claim 1, wherein each of the nanoparticles is coated with an anti-flocculant coating.

4. The light emitting device of claim 1, wherein the nanoparticles are formed by physical-vapor process.

5. The light emitting device of claim 1, wherein the host material is selected from a group comprising epoxy, plastics, and glass.

6. The light emitting device of claim 1, wherein the material that forms the nanoparticles is selected from a group comprising Titanium dioxide ($TiO_2$), Magnesium Oxide (MgO), Yttria (YtO), Zirconia ($ZrO_2$), $CeO_x$, Alumina ($Al_2O_3$), Lead Oxide ($PbO_x$), a composite material of Yttria and Zirconia, Gallium Nitride (GaN), Silicon Nitride (SiN), Aluminum Nitride (AlN), Zinc Selenide (ZnSe), Zinc Sulplhide (ZnS), and an alloy comprising Zn, Se, S, and Te (Tellurium).

7. The light emitting device of claim 1, wherein the refractive index of the high refractive index package material is approximately between 1.6 and 3.0.

8. The light emitting device of claim 1, wherein the high refractive index package material is an insulating composite material.

* * * * *